United States Patent
Molina, Sr. et al.

(10) Patent No.: US 6,893,942 B2
(45) Date of Patent: May 17, 2005

(54) METHOD FOR SEPARATING A MASK FROM THE SURFACE OF A SEMICONDUCTOR WAFER

(75) Inventors: Michael (Miguel) Anthony Molina, Sr., Austin, TX (US); Michael Anthony Molina, II, Cedar Park, TX (US); Joseph Albert Ojeda, Sr., Austin, TX (US)

(73) Assignee: Hi-Tech Products, Inc., Austin, TX (US)

( * ) Notice: Subject to any disclaimer, the term of this patent is extended or adjusted under 35 U.S.C. 154(b) by 0 days.

(21) Appl. No.: 10/666,649

(22) Filed: Sep. 19, 2003

(65) Prior Publication Data

US 2004/0058514 A1 Mar. 25, 2004

Related U.S. Application Data

(60) Provisional application No. 60/412,367, filed on Sep. 20, 2002.

(30) Foreign Application Priority Data

Sep. 19, 2003 (FR) ............................. 02 11608

(51) Int. Cl.$^7$ ............................................. H01L 21/46
(52) U.S. Cl. ...................................... 438/458; 438/459
(58) Field of Search ............................... 438/458–459, 438/406

(56) References Cited

U.S. PATENT DOCUMENTS 6,117,778 A * 9/2000 Jones et al. ................. 438/692

* cited by examiner

*Primary Examiner*—Dung A. Le
(74) *Attorney, Agent, or Firm*—Howison & Arnott, L.L.P.

(57) ABSTRACT

A method for separating a mask from the surface of a semiconductor wafer comprises first mounting a mask/wafer combination on a rotatable surface and then rotating the rotatable surface. A separating device is inserted at the edge of the mask between the two mating services of the mask and the semiconductor wafer. The semiconductor device is then urged upward toward the rotating center of the mask/wafer combination while the rotatable surface is rotating.

10 Claims, 3 Drawing Sheets

METHOD FOR SEPARATING A MASK FROM THE SURFACE OF A SEMICONDUCTOR WAFER

CROSS-REFERENCE TO RELATED APPLICATIONS

This application claims benefit of Provisional application U.S. Ser. No. 60/412,367, filed on Sep. 20, 2002, entitled "Computer Controlled De-Clip-Shadow Mask Removal Machine."

TECHNICAL FIELD OF THE INVENTION

The present invention relates to a Controlled Collapse Chip Connection (C4) manufacturer's ability to reduce operational expense during a delicate mask removal wafer handling process.

A shadow mask is a mask that is utilized for disposing structures on a silicon substrate through metal evaporation. During fabrication, the silicon wafer and mask can be held together using a Top Ring Assembly (TRA). The TRA can be bound together by a plurality of expandable clips. When the clips are compressed, they provide enough force to secure the assembly together. During a metal evaporation process, the shadow mask becomes adhered to a silicon wafer. After the process, the operator can manually remove the metal clips that bind the TRA. Such manual removal typically results in safety and efficiency limitations because the clips are small, difficult to maneuver, and sharp. As such, these clips are difficult to handle and can possibly cut through an operator's clean room glove resulting in an injury to the operator's hand. In such a situation, the operator would have to exit the clean room, treat the wound, throw away the cut gloves and perform a re-qualification procedure to return back to the clean room.

Further, it is believed that the current manual method yields a potential 1.5 to 3.0 million-dollar per/year loss in damaged products due to "kinking" of masks during the removal process.

BACKGROUND OF THE INVENTION

Once the clips are removed, the mask must be separated from the wafer. The current method for doing so is a manual process in which the operator peels the mask from the wafer by hand. In the past, the thickness and hole density in the masks were not enough to cause much difficulty in removing the mask; the operator could manually remove them without much effort. As technology advanced, so did the trend to make components smaller and thinner, resulting in a less structurally sound and more delicate mask product. Delicate masks carry a greater expense and have proven to be easier to damage during the manual removal process. The more delicate masks have made the removal operation more difficult, creating new problems. Damaged shadow masks can greatly affect production costs due to limited availability or the requirement to have high inventories. It would be beneficial to automate both the clip removal and the mask removal process.

SUMMARY OF THE INVENTION

An objective of the present invention is to automate the removal of the shadow mask from the silicon wafer after the metal evaporation process. The heretofore utilized manual process is replaced with an automated system as described by the present invention that encompasses a new computer controlled de-clip-shadow mask removal machine that overcomes the limitations and problems associated with the prior art method and systems. This removal machine includes an automated, computer controlled, fully programmable machine to remove retaining clips and separate a shadow mask from semiconductor wafer after a special metal evaporation process. Using such an invention, various industries (such as the semiconductor industry) could significantly reduce the amount of money lost in damaged products. With a controlled environment, twenty-four shifts could produce consistent, high-output results. The machine includes a designated location for the operator to place the TRA. Once the TRA is fully nested, stainless steel pushers can remove the clips at the receipt of a command (via, for example, a press of a button). The system employs two or three axis of motion to address the mask removal issues and accommodates a variety of different wafer sizes by slightly modifying a vacuum chuck, a de-clip station and a program described further below. Such wafer sizes range, for example, from about a 4 inch diameter to about a 12 inch diameter. An advantage to a computer-controlled machine will be that each action will have a higher degree of repeatable precision. The machine would further increase safety and virtually eliminate mask damage. Once acceptable parameters are established and programmed, the machine maybe integrated with existing systems to improve overall productivity.

DETAILED DESCRIPTION OF THE INVENTION

Figure 1:
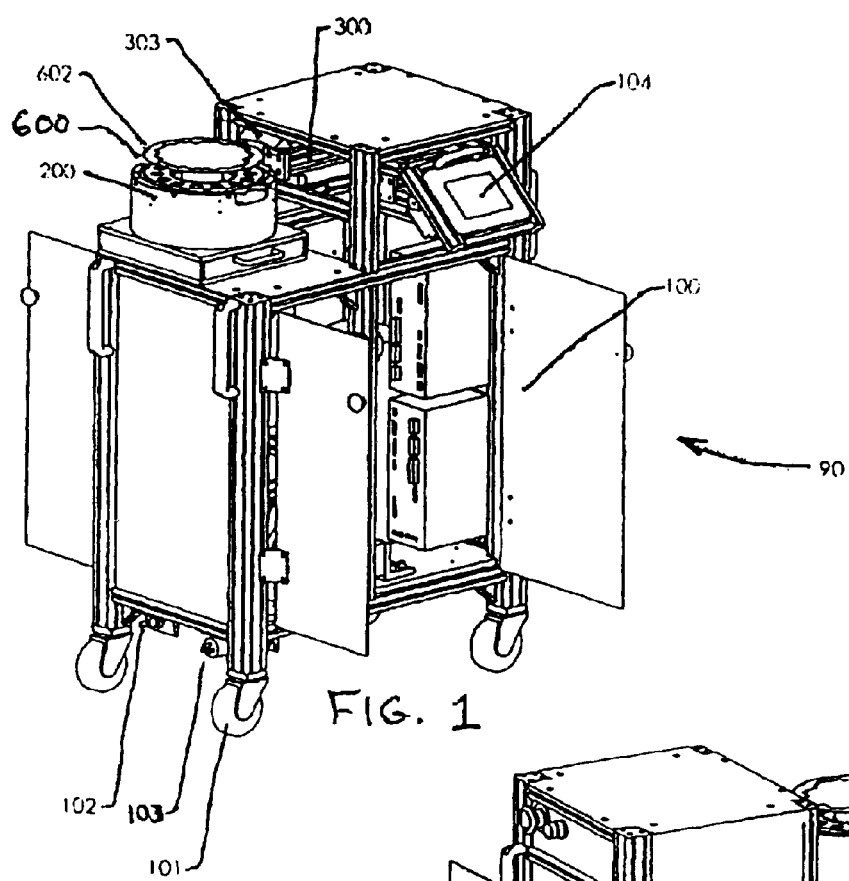
FIG. 1 is a perspective front right isometric view of the machine according to the present invention.

Referring now to FIG. 1, there is illustrated a perspective front right isometric view of a computer controlled de-clip-shadow mask removal machine 90 according to the present invention. The rigid frame assembly 100, with its clean room safe, anti-static ESD wheels 101, makes this machine both stable and portable. The de-clip station 200 with its alignment pins 201 (FIG. 3) and alignment slots 202 (FIG. 3) make placement of the TRA 600 consistent and reliable. Position of the horizontal assembly 300 is shown as an example only and may be positioned in a variety of locations such as on either side of or behind the de-clip station 200. The human-machine interface (HMI) 104 may be a monitor, such as a touch screen monitor, which interacts between an operator (not shown) and the machine 90. The program displays graphics, instructions, and other information relevant to that particular stage. The operator may select an appropriate command via an input such as a "button" on a touch screen or a voice recognition system to advance to a next stage of operation. A quick-connect air inlet adapter 102 is used to supply air to the system. This single air standard 110-wall socket plug 103 can be used to supply power to the entire system 90 or a power source can be self-contained within the system. Further, the incoming power source for the machine 90 may vary to suit different plants.

Figure 2:
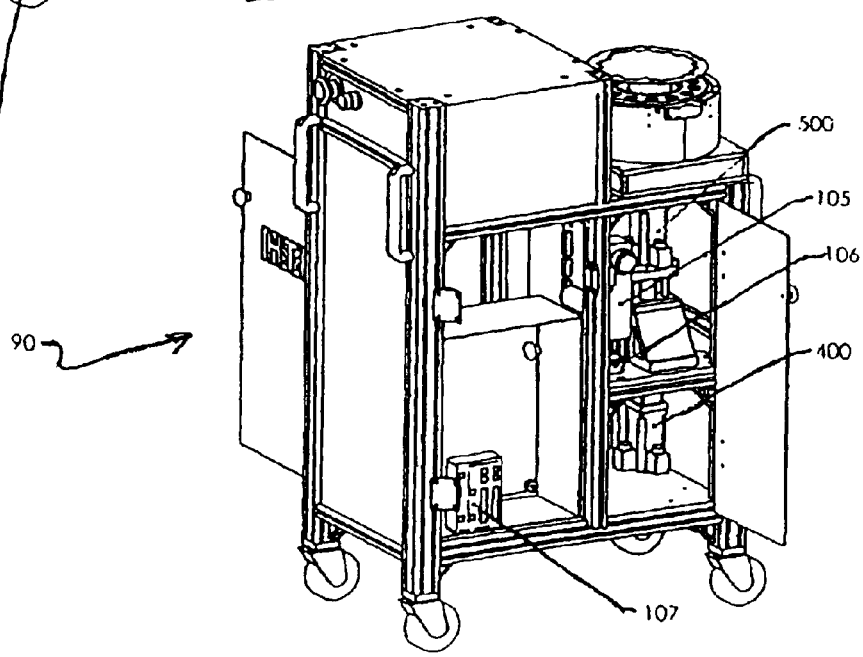
FIG. 2 is a perspective rear right isometric view of the machine of FIG. 1 according to the present invention.

Referring now to FIG. 2, there is illustrated a perspective rear right isometric view of the machine 90. A vacuum generator 105 creates a vacuum from the incoming air source coming through the inlet adapter 102 and supplies vacuum to a vacuum chuck 503 (FIG. 5). The machine 90 uses vacuum to hold the wafer 603 (FIG. 3) on the vacuum chuck 503 during rotation. A vacuum sensor 106 is computer controlled to insure proper pressure is maintained for each type of wafer 603 being processed.

Figures 3, 3A:
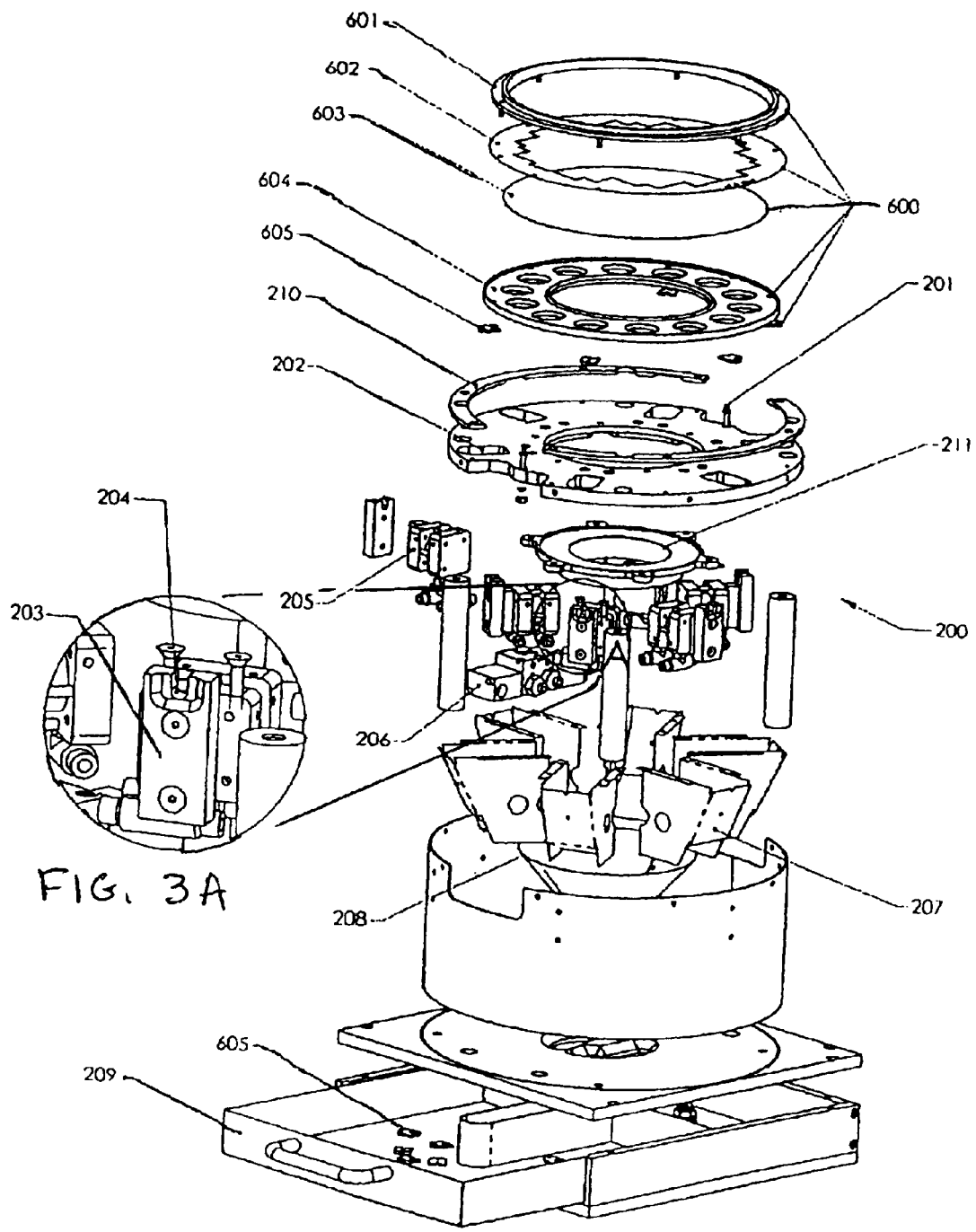
FIG. 3 is an exploded left isometric view of the de-clip station of FIG. 1 according to the present invention.
FIG. 3A is an enlarged view of a portion of the apparatus shown in FIG. 3.
Figures 4, 5:
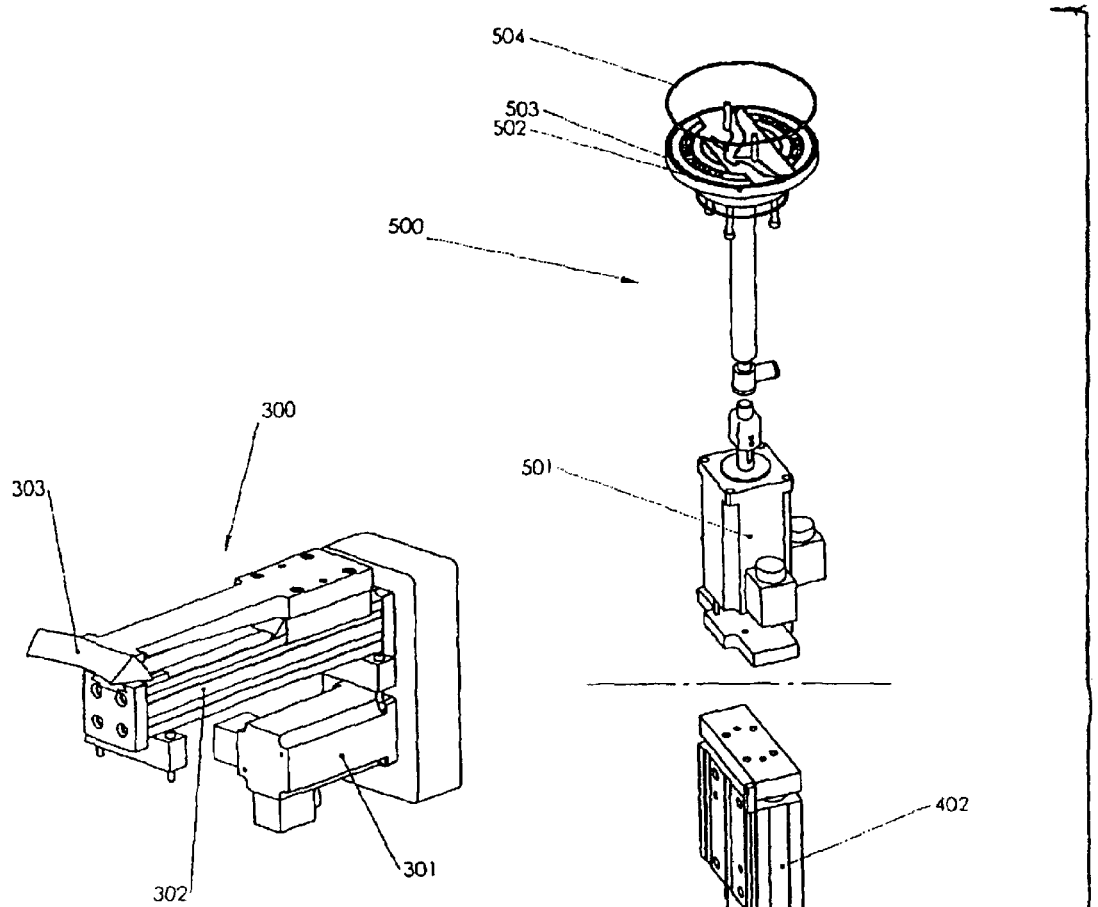
FIG. 4 is a perspective left view of a horizontal (wedge) assembly according to the present invention.
FIG. 5 is an exploded left isometric view of a vertical slide assembly according to the present invention.

Referring now to FIG. 3 and FIG. 3A, there is illustrated an exploded left isometric view of the de-clip station 200. The TRA 600 is placed on the de-clip station 200 and oriented by the alignment pins 201. The TRA is comprised of a top ring 601 and a bottom clip 604, between which are disposed a mask 602 over a wafer 603. The rings 601 and 604 are held together by clips 605. The alignment slots 202 act as a go-no-go gage helping to insure that the clips 605 are in the right orientation for removing. A number of actuators 205 (for example, about 2 about 12 and preferably 6), controlled by a valve 206, push an equal number of the de-clip blocks 203 in an outward direction for removal thereof. Such de-clip blocks 203 include a slot 204 that can completely remove the clips 605 from the retaining pins 201. The clip shield 210 prevents the removed clips 605 from being projected out of the nest area protecting the operator. The clips 605 can safely fall down the ramps 207 into a funnel 208 and to a removable clip tray 209.

Referring now to FIG. 4, there is illustrated a perspective left isometric of the horizontal assembly 300. This axis consists of a horizontal slide 302, which propels the de-masking wedge 303. The de-masking wedge 303 makes contact with the mask 602, (FIG. 3). The de-masking wedge 303 then moves towards the center to dislodge the wafer 603 from the mask 602. Such movements may be performed at a plurality of speeds and preferably at a slower speed. The position of the de-masking wedge 303 may be programmed and precisely controlled by the servomotor 301.

Referring now to FIG. 5, there is illustrated an exploded left isometric view of both the vertical assembly 400 and the rotation assembly 500. The vertical assembly 400 consists of a vertical slide 402 and servomotor 401 mounted underneath the de-clip station 200 to provide controlled vertical motion for the vacuum chuck 503. The o-ring 504 on the vacuum chuck 503 seals both the mask 602 and the wafer 603 via the vacuum generator 105 (FIG. 2) through the vacuum distributor 502. The vertical position of the vacuum chuck 503, relative to the de-masking wedge 303 (FIG. 4) may be programmed and precisely controlled by servomotor 401. The speed at which the rotation assembly 500 spins the vacuum chuck 503 is programmed and precisely controlled by servomotor 501. The positional bearing 211 (FIG. 3) stabilizes the position of the rotation assembly 500.

Operational Flow

The following describes the operation of the de-mask station, it being understood that the steps in the operation may be performed either in the presented order or in any other order according to the present invention. Initially, the operator follows the computer images and instructions on the HMI 104. The HMI 104 may prompt the operator to select the mask type with which to run for the current operation. The operator may then be prompted to manually place a top ring assembly 600 on top of the de-clip station 200 using the alignment pins 201 as a guide and the alignment slots 202 as a gage to insure proper repeatability. The machine 90 can simultaneously remove all the clips 605 from the TRA 600 based on an appropriate received command. This action frees the top ring 601 from the bottom ring 604. The machine's computer or controller 107 can send a signal to activate the onboard vacuum generator 105 to secure the wafer 603 to the vacuum chuck 503 via the vacuum distributor 502. The operator may then manually remove the top ring 601 from the TRA 600. An appropriate command, shown on the display of the HMI 104, may then be input by the operator to advance to the next step.

At the next step, in response to changing images and brief descriptions on the display of the HMI 104 that are presented to the operator, the machine 90 may perform a series of steps that may not require operator intervention. The machine 90 will lift the wafer 603 and the mask 602 up to a particular position at a particular speed with the assembly 400 (which may be programmed, set by the operator, static and/or dynamic, for example), using a computer driven vertical slide 402. The machine's horizontal servomotor 301 can then move the horizontal slide 302 to a particular position at a particular speed (which may be programmed, set by the operator, static and/or dynamic, for example) thus placing the de-masking wedge 303 slightly under the rotating mask 602. The machine's rotation servomotor 501 can spin the computer driven rotation axis 500 at a particular speed (which may be programmed, set by the operator, static and/or dynamic, for example). The vertical assembly 400 can lower the vacuum chuck 503 to a particular position at a particular speed (which may be programmed, set by the operator, static and/or dynamic, for example).

After positioning th de-masking wedge 303 as noted, the de-masking wedge 303 may move toward the center of the mask 602 at a particular speed (which may be programmed, set by the operator, static and/or dynamic, for example). The de-masking wedge 303 can peel the mask 602 from the wafer 603 until it is completely separated from the wafer 603. Once the mask 602 is free, the machine's computer or controller 107 will stop all motors in motion. The HMI 104 can prompt the operator to then remove the mask 602 from the wafer 603. Following the images and instructions on the display, the operator initiates the appropriate commands, which send the de-masking wedge 303 back to a horizontal retract position. The machine's vertical servomotor 401 lowers the vacuum chuck 503 to a vertical retract position. The machine's computer or controller 107 will turn off the vacuum generator 105 to enable the operator to remove the wafer 603 and the bottom ring 604 from the de-clip station 200. Speeds for initial and retract positions may vary. The HMI 104 will prompt the operator to change the mask type, re-run the same mask type, or to completely end the cycle.

As a summary, the computer controlled de-clips-shadow mask removal machine of the present invention may comprise at least one of the following elements that may perform at least one of a following functions:

1. a rigid frame constructed of welded fabrication and/or structural metal extrusion.
2. a computer or controller to control the de-clip action and de-masking process.
3. the computer or controller may store appropriate programmable speeds and position settings to accommodate various mask types, into separate subprogram(s) or receipt(s).
4. a touch screen or push button HMI with graphic and/or text display to interact with operator(s).
5. the computer or controller may store the speeds and position settings to accommodate various the mask types, into separate the subprograms or recipes.
6. the de-clip station comprising at least one of a following elements from a group consisting of:
   at least one alignment pin and alignment slot for reliable removal of clips;

a nesting area to secure a bottom ring;

computer controlled actuators (pneumatic, electro-pneumatic or electronic) to proper de-clip blocks to remove the clips;

the program to activate the computer controlled actuators to remove the clips;

a clip shield to contain the clips after propelled from the nest area;

ramps to guide the clips down funnel out of the de-clip station; and a removable tray located under the de-clip station to contain the clips after de-clip sequence.

7. A vacuum chuck to hold the wafer by vacuum; the system shall regulate range of vacuum between, for example, 30 in/Hg to about −60.00 in/Hg, and preferably about −10 in/Hg to about −30.00 in/Hg.

8. The system may employ three axis of motion to remove the mask from the wafer.

a vertical axis to raise and lower the vacuum chuck to the programmable distance(s) from the wafer, ranging between, for example, −5.00 inches to about 10.00 inches, and preferably about −1.00 inches to about 2.99 inches traveling at speeds ranging between, for example, 0.50 inches per second to about 750.00 inches per second, and preferably about 5.00 inches per second to about 300.00 inches per second, best suited for safety of the wafer and efficiency for production.

a rotation axis to spin the vacuum chuck at the programmable speeds ranging between, for example, 5.00 rpm to about 5000.00 rpm, and preferably about 25.00 rpm to about 2000.00 rpm, best suited to minimize friction force required for the wedge to remove the mask and efficiency for production.

a horizontal axis to move the wedge in a horizontal direction between the mask and the wafer to separate the two, while simultaneously spinning the vacuum chuck; the programmable distance(s) from the wafer center, ranging between, for example, 0.005 inches to about 15.99 inches, and preferably about 0.05 inches to about 8.99 inches traveling at speeds ranging between, for example, 1.00 inches per second to about 500.00 inches per second, and preferably about 10.00 inches per second to about 250.00 inches per second, best suited for safety of the wafer and efficiency for production.

The HMI 104, may perform at least one of a following step from a group consisting of: (a) shall display images and/or instructions to prompt the operator(s) to follow entire sequence easily; (b), the interface will prohibit the operator (s) from accessing sensitive data; (c), only certified administrators will have access to the critical files/recipes and settings and (d) the operator(s) will select the subprogram(s) or recipe(s) for the appropriate the mask type; (e) the try will have a removable drawer for convenient storage of the clips once removed; (f) the vertical programmed positions will keep the wedge at a close, yet safe distance from the wafer to keep from inducing a stress that may kink the masks; (g) the vertical positions and speeds will be programmed in the recipes; (h) the rotation speeds will be programmed in the recipes; and (i) the horizontal positions and speeds will be programmed in the recipes, which shall be recalled in a program by the program to produce consistent results of high productivity in removing the clips and the mask from the wafer after the metal evaporation process.

Although the preferred embodiment has been described in detail, it should be understood that various changes, substitutions and alterations can be made therein without departing from the spirit and scope of the invention as defined by the appended claims.

What is claimed is:

1. A method for separating a mask from the surface of a semiconductor wafer when configured as a mask/wafer combination, comprising the steps of:

mounting the mask/wafer combination on a rotatable surface;

rotating die rotatable surface;

inserting a de-masking device at the edge of the mask between the two mating surfaces of the mask and the semiconductor wafer; and urging the de-masking device toward the rotating center of the mask/wafer combination while the rotatable surface is rotating.

2. The method of claim 1, wherein the surface of the semiconductor wafer diametrically opposite the mask is disposed proximate to the surface of the rotatable surface.

3. The method of claim 2, further comprising the step of moving the rotatable surface away from the de-masking device with the semiconductor wafer attached thereto.

4. The method of claim 3, wherein the step of moving the rotatable surface comprises the moving the rotatable surface as a function of the movement of the de-masking device toward the rotating center of the mask/wafer combination.

5. The method of claim 1, wherein the mask comprises a metal mask.

6. The method of claim 5, wherein the metal mask comprises a shadow mask.

7. The method of claim 1, wherein the de-masking device comprises a wedge shaped device.

8. The method of claim 1, further comprising the step of programming the rotational speed of the rotatable surface.

9. The method of claim 1, wherein the mask/wafer combination is held onto the rotatable surface by a vacuum.

10. The method of claim 1, and further comprising the step of urging the surface of the mask/wafer combination downward as the de-masking device is moved toward the rotating center of the mask/wafer combination while the rotatable surface is rotating.

* * * * *